(12) United States Patent
Van Velzen et al.

(10) Patent No.: US 8,872,359 B2
(45) Date of Patent: Oct. 28, 2014

(54) MEMS DEVICES

(75) Inventors: Bart Van Velzen, Arnhem (NL); Hans Van Zadelhoff, Andelst (NL); Greja Johanna Adriana Maria Verheijden, Riethoven (NL)

(73) Assignee: NXP, B.V., Eindhoven (NL)

( * ) Notice: Subject to any disclaimer, the term of this patent is extended or adjusted under 35 U.S.C. 154(b) by 7 days.

(21) Appl. No.: 13/378,240

(22) PCT Filed: Jun. 24, 2010

(86) PCT No.: PCT/IB2010/052900
§ 371 (c)(1),
(2), (4) Date: Dec. 14, 2011

(87) PCT Pub. No.: WO2010/150224
PCT Pub. Date: Dec. 29, 2010

(65) Prior Publication Data
US 2012/0091561 A1    Apr. 19, 2012

(30) Foreign Application Priority Data
Jun. 25, 2009 (EP) ................................. 09163780

(51) Int. Cl.
*H01L 23/29* (2006.01)
*H01L 21/14* (2006.01)
*H01L 21/00* (2006.01)
*B81C 1/00* (2006.01)

(52) U.S. Cl.
CPC ..... *B81C 1/00333* (2013.01); *B81C 2203/0136* (2013.01)
USPC .............. 257/795; 257/702; 257/532; 438/51

(58) Field of Classification Search
USPC ................. 257/415–420, 532–543, 678–796; 438/50–56, 106–127, 386–399
See application file for complete search history.

(56) References Cited

U.S. PATENT DOCUMENTS

| 8,183,474 | B2 | 5/2012 | Gillot et al. | |
| 2003/0183916 | A1 | 10/2003 | Heck et al. | |
| 2004/0137728 | A1* | 7/2004 | Gallagher et al. | ............ 438/689 |

(Continued)

FOREIGN PATENT DOCUMENTS

| CN | 101331080 A | 12/2008 |
| DE | 10 2006 031772 A1 | 1/2008 |

(Continued)

OTHER PUBLICATIONS

International Search Report and Written Opinion for In'tl. Patent Appln. No. PCT/IB2010/052900 (Aug. 27, 2010).
Office Action from counterpart application CN 201080027903.9 (Jul. 3, 2014).

*Primary Examiner* — Karen Kusumakar

(57) ABSTRACT

A method of manufacturing a MEMS device comprises forming a MEMS device element (12). A sidewall (20) is formed around the MEMS device element, and a sacrificial layer (14) is formed over the device element and within the sidewall. A package cover layer (16) is provided over the sacrificial layer, and the sacrificial layer is removed. This method provides additional sidewalls to the cap provided over the MEMS device. These additional sidewalls can then be deposited by a different process and be formed of a different material to the top part of the package cover layer. The sidewalls can prevent reflow of the sacrificial layer and improve the sealing properties of the sidewalls.

19 Claims, 3 Drawing Sheets

(56) References Cited

U.S. PATENT DOCUMENTS

| | | |
|---|---|---|
| 2005/0127499 A1 | 6/2005 | Harney et al. |
| 2006/0144142 A1 | 7/2006 | Gogoi |
| 2008/0164542 A1* | 7/2008 | Yang et al. .................. 257/415 |
| 2008/0217709 A1* | 9/2008 | Minervini et al. ............ 257/416 |
| 2009/0075431 A1* | 3/2009 | Warren et al. ................ 438/126 |
| 2009/0294880 A1 | 12/2009 | Feyh |
| 2011/0210435 A1 | 9/2011 | Verheijden et al. |

FOREIGN PATENT DOCUMENTS

| | | |
|---|---|---|
| EP | 1 775 259 A1 | 4/2007 |
| FR | 2901264 A1 | 11/2007 |
| WO | 2005/089348 A2 | 9/2005 |

* cited by examiner

MEMS DEVICES

This invention relates to MEMS devices, and in particular to the formation of packaged devices.

MEMS technologies are increasingly being used in integrated circuits. However, numerous product concepts have not been implemented in practice as a result of difficulties providing suitable and cost effective packaging. Because MEMS devices are fragile as a result of the moving parts, and the device performance is affected by impurities, they have to be protected by such packaging both for the final use of the device but also during wafer dicing and bonding (when individual devices are separated from a substrate on which an array of devices has been formed).

There are many contributing factors to the high costs in packaging of MEMS devices and systems. The three principal factors are:

proper packaging and efficient assembly of parts and components of sizes less than a few millimeters for MEMS system, with complex geometries, requires special tools and fixtures.

the high diversity of MEMS devices and systems makes requirements for reliable packaging vary significantly from one product to another. For example, vacuum packing for hermetic sealing is a necessity in many cases.

the small size of parts and components in MEMS devices and systems creates many unique problems in both packaging and assembly.

There are a number of techniques used for encapsulating MEMS devices:

use of off-the-shelf packages and careful handling techniques;

attachment of a separate cap, usually glass or silicon, on top of a finished MEMS device part;

integrated wafer level package (WLP) encapsulation.

The selection of off-the-shelf components is a costly and time-consuming process.

The use of a separate cap requires a capping wafer, which typically comprises a pre-fabricated cavity formed of glass or silicon. Anodic of frit glass bonding is then used, because of the back-end compatible process temperatures (400° C.) in preference to fusion bonding at much higher temperatures (1000° C.). A vacuum inside the cavity can be achieved if the bonding is performed in a vacuum chamber. This approach requires wafer bonding and flip-chip alignment equipment.

An integrated wafer-level solution involves fabricating caps using standard surface micro machining techniques. This approach consumes less area and the chip height is kept lower than if an independently manufactured cap is used. If the encapsulation is strong enough, the MEMS chip can be further packaged like a normal IC, which is cost effective. Furthermore this allows the possibility of integration with CMOS processes.

In a wafer level encapsulating process, the MEMS structure is built inside a cavity with an encapsulation shell using normal process steps. For most MEMS structures, for instance resonators, the Q-factor increases at lower pressures due to less air-damping. This means that some applications require the encapsulating shell to be hermetic to avoid the Q-factor decreasing over time.

A known WLP construction method makes use of two stacked layers. Schematic cross sections are given in FIGS. 1A to 1C.

The figures show the substrate 10, the MEMS device 12, and a lower layer 14 of sacrificial material. The lower layer 14 is patterned to extend beyond the active MEMS device 12 at all sides. An upper layer 16 consists of a capping material.

The upper layer 16 is deposited to cover/encapsulate the bottom layer 14 at all sides as shown in FIG. 1B. Layer 16 can be patterned for electrical contact with layer 10 for operating device 12.

The sacrificial material is removed to create a cavity around the MEMS device as shown in FIG. 1C. Optionally there are release holes in the upper layer to enable removal of the sacrificial material, which are sealed by a third layer. An example consists of:

the lower layer 14 of a polymer;

the upper layer 16 of silicon oxide;

removal of the polymer material by thermal degradation as represented by arrows in FIG. 1C.

A common problem with this WLP construction method is that there are conflicting constraints for the materials used and process settings. For the example above, there are conflicting constraints on:

the polymer glass temperature (Tg) of the lower layer 14: a low Tg polymer will have reflow problems, whereas a high Tg polymer will be difficult to degrade;

the silicon oxide deposition temperature: at low temperature, step coverage is poor and at high temperature, the polymer will degrade.

This invention relates to an improved integrated approach for forming MEMS device packaging.

According to the invention, there is provided a method of manufacturing a MEMS device, comprising:

forming a MEMS device element;

forming a sidewall around the MEMS device element forming a sacrificial layer over the device element and within the sidewall;

forming a package cover layer over the sacrificial layer;

removing the sacrificial layer.

This method provides additional sidewalls to the cap provided over the MEMS device. These additional side walls can then be deposited by a different process and be formed of a different material to the top part of the package cover layer. The sidewalls can prevent reflow of the sacrificial layer and improve the sealing properties of the sidewalls.

The sacrificial layer can comprise a thermal degradable polymer layer. The package cover layer is then porous to the thermally degraded sacrificial layer. The package cover layer can comprise silicon oxide, and the thermal degradable layer can comprise Unity 400 or Shipley XP0733. However, other thermal degradable polymers will be well known to those skilled in the art.

The thermal degradable layer can be deposited by spin coating.

The sidewall is preferably formed from a hermetic material for instance silicon nitride and formed by LPCVD or PECVD. A non-hermetic cured organic material can instead be used for the sidewalls.

The forming of a sidewall can further comprise forming supporting pillars within the space defined by the sidewall. These pillars of sidewall material can provide additional support to the top capping layer.

The invention also provides a packaged MEMS device, comprising:

a MEMS device element;

a cavity above the MEMS device element, wherein the cavity has a sidewall around its periphery; and a package cover layer provided over the cavity and the sidewall.

The MEMS device element can comprise a switch, capacitor or resonator.

Examples of the invention will now be described with reference to the accompanying drawings, in which.

The invention provides a method of manufacturing a MEMS device in which a cavity is formed over the MEMS device element. The cavity has side walls in addition to the packaging cover layer.

FIG. 2 shows an example of wafer level encapsulation process of the invention.

Figure 2A:
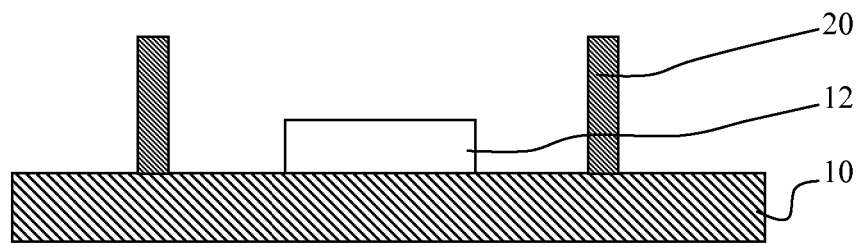
FIG. 2 shows an example of wafer level encapsulation process of the invention and shows as the final step an example of packaged MEMS device of the invention.

FIG. 2A shows the MEMS device element 12 formed on the substrate 10. A sidewall 20 is formed around the MEMS device element 20. The sidewall is formed on top of the substrate which carries the MEMS device element. The sidewall is patterned to surround the MEMS device at all sides. The sidewall is patterned in conventional manner to define a purely vertical structure.

This means a dedicated layer of different material with independent process settings is used for the cavity sidewalls than for the cavity top surface. This provides a solution to remove many conflicting constraints. These constraints arise from the fact that the sidewalls of the cavity are normally constructed from the upper layer.

In one example, the sidewall is made from a nitride, for example silicon nitride. This is applied by LPCVD. LPCVD nitride is a hermetic material with a deposition temperature higher than the melting temperature of the degradable polymer.

Figure 2B:
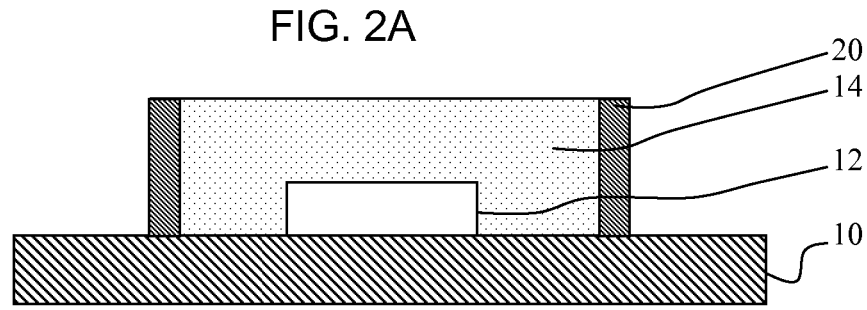

A sacrificial layer 14 is formed over the device element 12 and within the sidewall as shown in FIG. 2B.

In a preferred example, the sacrificial layer is a Thermal Degradable Polymer (TDP) material such as Unity 400 or Shipley XP0733.

Shipley XP0733 is a commercially available polymethylmethacrylate material, developed for air gap in interconnect structures within an integrated circuit. The material can be applied by spin-coating, and after an initial soft bake at approximately 150° C., it is completely stable up to 300° C. If the temperature is increased to above 350° C., up to 400° C., the material decomposes without any residues.

Unity 400 is commercially available from the company "Promerus Electronic Materials", and again this thermally decomposes leaving no residues.

These are examples of materials that can be applied by spin coating and can be planarized to a high degree. The thickness matches the height of the sidewalls. Outside the confining sidewalls 20, all sacrificial material is removed by normal patterning.

The normal process is then resumed.

Figure 1A:
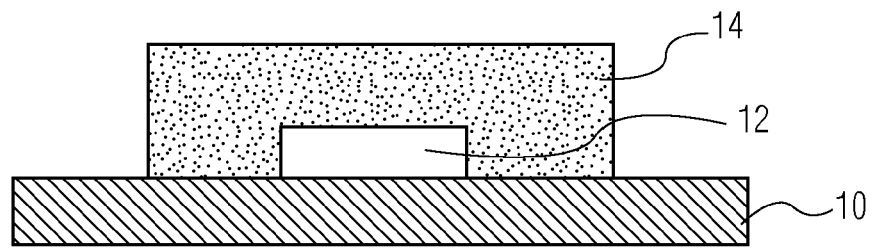
FIG. 1 shows a known wafer level encapsulation process.
Figure 1B:
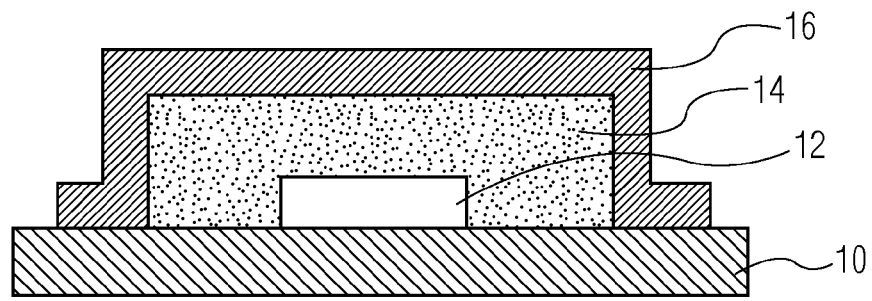
Figure 1C:
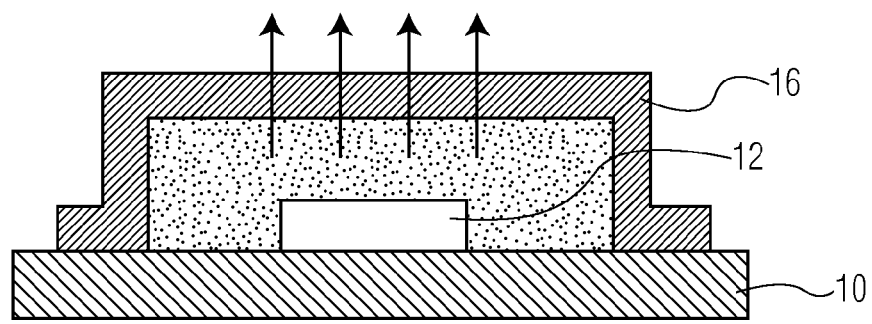
Figure 2C:
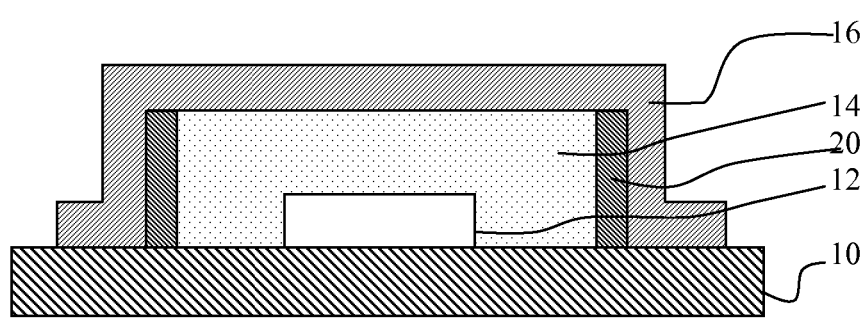

Thus, a package cover layer 16 is formed over the sacrificial layer 14 as shown in FIG. 2C. This upper layer is applied and patterned to extend beyond the sidewalls. Thus, in the same way as in FIG. 1, the package cover layer (16) extends down to the substrate and thereby covers and encapsulates the sidewall. This means that the side wall is made up of the materials of both the sidewall and the package cover layer. The cap over the MEMS device element is made only of the upper layer, so that the upper layer defines the roof of the cavity.

The upper layer 16 can comprise silicon oxide or silicon oxycarbide (SiOC, which is naturally porous). The high deposition temperature of the silicon oxide and SiOC (for example a PECVD process at over 300° C. up to around 400° C.) will cause some reflow of the polymer layer 14, but this reflow is constrained by the sidewall 20. The sidewall is able to withstand the silicon oxide deposition temperature, as it is formed of LPCVD or PECVD nitride. Thus, the problem of polymer reflow is avoided.

Figure 2D:
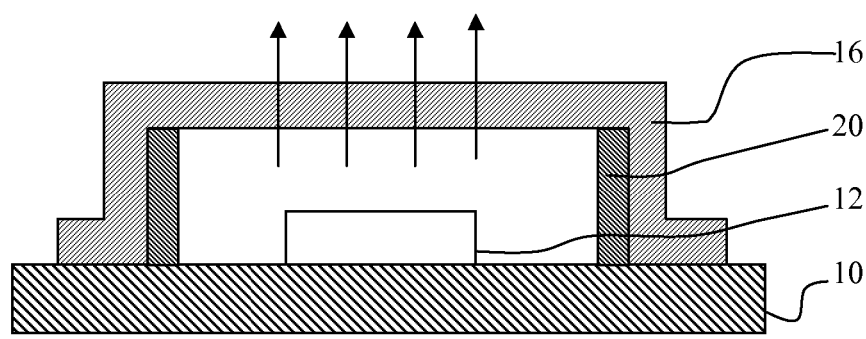

The sacrificial layer 14 is then removed as shown in FIG. 2D, by gas escape through the porous silicon oxide capping layer. Some residues of the sacrificial layer may remain.

The sacrificial layer is removed by escape of the degraded material gas from the cavity. UV assisted curing can be employed. A further layer can be provided over the top of the capping layer to seal the cavity depending on the requirements of the MEMS device. The sealing layer would then be deposited in a vacuum environment.

When a hermetic cavity is required, the sidewalls 20 have the additional benefit that they are deposited before the sacrificial layer is present on the wafer and that the deposition temperature therefore is not limited. This has the benefit that a good quality layer can be chosen. Strong sidewalls also avoid collapsing of the cavity.

The sacrificial layer can be a different material, and does not have to be removed by temperature treatment. For example, it could be a polymer removed by an oxygen plasma.

Etching release holes can then be sealed by a cover sealing layer. This can be a PVD (physical vapour deposition) layer such as Aluminium. The sealing layer is applied at a low pressure so that the cavity is sealed at the desired low pressure.

Figure 3:
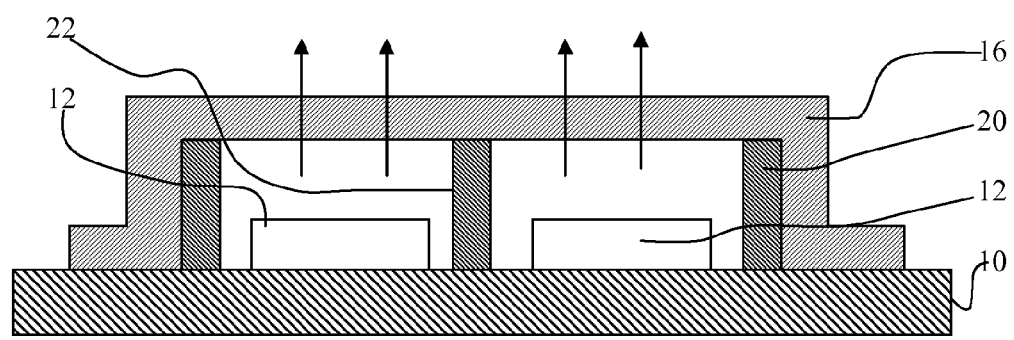
FIG. 3 shows another example of packaged MEMS device of the invention.

The sidewall deposition can be used to provide additional support structures 22 as shown in FIG. 3, for example for a larger cavity containing multiple MEMS devices 12.

The manufacture of the MEMS device does not need to be altered by this invention, and any conventional techniques can be used. The MEMS device can be a resonator, capacitor or switch, for example. Typically, the device has a movable portion which needs to be carefully protected by the packaging—for example the device can have a suspended resonator mass. A CMOS process can be used, by enabling all process steps to be carried out at temperatures below around 450° C., thereby avoiding damage to already formed CMOS devices.

The invention can use materials with a low flow point temperature, not only TDP materials. The use of polymers enables deposition with low stress, and with low cost and deposition processes and tooling and low temperature deposition.

By depositing the side walls before the sacrificial layer, the deposition temperature of the side wall can be higher than the reflow temperature of the sacrificial layer.

One main application of the invention is MEMS resonators. These resonators can be used to substitute crystal oscillators for timing reference purposes.

Various modifications will be apparent to those skilled in the art.

The invention claimed is:

1. A method of manufacturing a MEMS device, comprising:
    forming a MEMS device element on a substrate;
    forming a sidewall on the substrate around the MEMS device element;
    forming a thermally degradable sacrificial layer over the device element and within the sidewall;
    forming a package cover layer over the sacrificial layer and the sidewall, the package cover layer thereby covering and encapsulating the sidewall and defining a roof of a cavity, said package cover layer being porous to said thermally degradable sacrificial layer; and
    removing the sacrificial layer.

2. A method as claimed in claim 1, wherein the package cover layer comprises silicon oxide.

3. A method as claimed in claim 1, wherein the thermally degradable layer comprises a polymethylmethacrylate material.

4. A method as claimed in claim 1, wherein the thermally degradable layer is deposited by spin coating.

5. A method as claimed in claim 1, wherein the sidewall is formed from at least one of silicon oxide, silicon nitride, polysilicon, silicon oxynitride and a cured organic material.

6. A method as claimed in claim 1, wherein the sidewall is formed by one of LPCVD and PECVD.

7. A method as claimed in claim 1, wherein the forming the sidewall further comprises forming a plurality of supporting pillars within a space defined by the sidewall.

8. A method as claimed in claim 1, wherein the MEMS device element comprises one of a switch, a capacitor and a resonator.

9. A packaged MEMS device, comprising:
- a MEMS device element on a substrate;
- a cavity above the MEMS device element, wherein the cavity has a sidewall around its periphery on the substrate; and
- a package cover layer provided over the cavity and the sidewall, the package cover layer thereby covering and encapsulating the sidewall and defining a roof of the cavity and further including residues of a thermally degradable polymer upon either said MEMS device element or said sidewall.

10. A device as claimed in claim 9, wherein the thermally degradable polymer comprises a polymethylmethacrylate material.

11. A device as claimed in claim 9, wherein the package cover layer comprises silicon oxide or an SIOC.

12. A device as claimed in claim 9, wherein the sidewall is formed from at least one of silicon oxide, silicon nitride, polysilicon, silicon oxynitride and a cured organic material.

13. A device as claimed in claim 9, wherein the MEMS device element comprises a switch, a capacitor and a resonator.

14. The method of claim 1, wherein forming a sidewall on the substrate around the MEMS device element includes forming a sidewall that prevents reflow of the sacrificial layer.

15. The method of claim 14, further including using the sidewall to prevent reflow of the sacrificial layer.

16. The device of claim 9, wherein the sidewall is configured and arranged to prevent reflow of the thermally degradable polymer.

17. The device of claim 9, further including residue of the thermally degradable polymer upon a portion of the package cover layer over the cavity.

18. The device of claim 9, wherein the package cover layer is configured and arranged with a porous structure that passes a degraded material gas of a thermally degradable sacrificial layer through the packaged cover layer.

19. The device of claim 9, wherein the package cover layer extends from a position over the cavity and along an outer surface of the sidewall that faces away from the cavity, and is in direct contact with the substrate.

\* \* \* \* \*